United States Patent
Chou

(10) Patent No.: US 12,481,227 B2
(45) Date of Patent: Nov. 25, 2025

(54) SUBSTRATE PROCESSING APPARATUS

(71) Applicant: ECLAT FOREVER MACHINERY CO., LTD., Taoyuan (TW)

(72) Inventor: Kun-Lin Chou, Taoyuan (TW)

(73) Assignee: ECLAT FOREVER MACHINERY CO., LTD., Taoyuan (TW)

( * ) Notice: Subject to any disclaimer, the term of this patent is extended or adjusted under 35 U.S.C. 154(b) by 424 days.

(21) Appl. No.: 17/994,414

(22) Filed: Nov. 28, 2022

(65) Prior Publication Data
US 2024/0176256 A1     May 30, 2024

(51) Int. Cl.
*G03F 7/00*     (2006.01)

(52) U.S. Cl.
CPC ...... *G03F 7/70925* (2013.01); *G03F 7/70525* (2013.01); *G03F 7/70825* (2013.01); *G03F 7/70991* (2013.01)

(58) Field of Classification Search
CPC ............ G03F 7/70925; G03F 7/70525; G03F 7/70825; G03F 7/70991
USPC ....................................................... 134/137
See application file for complete search history.

(56) References Cited

U.S. PATENT DOCUMENTS

| | | | | |
|---|---|---|---|---|
| 5,321,885 A | * | 6/1994 | Hino | B23P 21/004 29/33 P |
| 5,865,319 A | * | 2/1999 | Okuda | G01R 31/2851 209/571 |
| 10,070,567 B2 | * | 9/2018 | Chen | H05K 13/0069 |
| 12,238,867 B2 | * | 2/2025 | Chou | G03F 7/70991 |
| 2012/0266457 A1 | * | 10/2012 | Hanamura | H05K 13/0434 312/223.1 |
| 2015/0197405 A1 | * | 7/2015 | Sakamoto | B65H 5/04 414/416.01 |
| 2015/0259017 A1 | * | 9/2015 | Laurence | B65G 17/32 198/801 |
| 2016/0016739 A1 | * | 1/2016 | Takano | B23P 21/004 198/345.3 |
| 2016/0068341 A1 | * | 3/2016 | Hamada | B65G 9/002 198/343.1 |
| 2023/0040192 A1 | * | 2/2023 | Rye | C23C 16/4584 |

FOREIGN PATENT DOCUMENTS

| | | | | |
|---|---|---|---|---|
| CN | 110970331 A | * | 4/2020 | ....... H01L 21/68728 |
| JP | 3232704 U | * | 7/2021 | |

* cited by examiner

*Primary Examiner* — Michael E Barr
*Assistant Examiner* — Thomas Bucci

(57) ABSTRACT

A substrate processing apparatus includes a substrate cleaning apparatus. Accordingly, the present application can be used for the transfer of the substrate cleaning and insertion frame, in order to achieve the effect of facilitating the transfer of the substrate to subsequent processes.

6 Claims, 25 Drawing Sheets

SUBSTRATE PROCESSING APPARATUS

BACKGROUND OF THE INVENTION

1. Field of the Invention

The present application relates to a substrate processing apparatus, and in particular to a substrate processing apparatus that facilitates the transfer of the substrate to subsequent processes.

2. Description of the Related Art

In general, during the cleaning and transfer process, the substrate often causes many inconveniences in the cleaning and transfer process because of the clamping problem of the substrate.

In addition, after the substrate is cleaned or carried out other related procedures, the common practice is to insert a plurality of substrates into an accommodating frame one by one, and then soak the accommodating frame into a liquid agent. However, with the development of the process, the substrate is becoming thinner and thinner, and when the substrate is too thin, it may cause warpage problems. As a result, the substrate cannot smoothly insert the substrate into a predetermined position of the accommodating frame, and the substrate is damaged.

Thus, it is desirable to create a substrate processing apparatus, with a view to using it for the transfer of the substrate, and can firmly clamp or release the substrate, and achieve the purpose of facilitating the transfer of the substrate to the subsequent processes, thereby effectively improving the shortcoming of prior art that are to be actively disclosed by the application.

BRIEF SUMMARY OF THE INVENTION

In view of the above disadvantages of the prior art, the inventor felt that it was not perfect, and exhausted his mind to research carefully, and then developed a substrate processing apparatus, with a view to using it for the transfer of the substrate, and achieving the purpose of facilitating the transfer of the substrate to subsequent processes.

To achieve the above objective and other objectives, the application provides a substrate processing apparatus, which comprises: a substrate cleaning apparatus. The substrate cleaning apparatus comprises a first frame, a first frame placement area, a substrate cleaning and drying area, a first frame clamping area and a first frame return area, the substrate cleaning and drying area is communicated to one side of the first frame placement area, the first frame clamping area is communicated to one side of the substrate cleaning and drying area, the first frame return area is communicated to the first frame clamping area and located at one side of the first frame placement area, the substrate cleaning and drying area and the first frame clamping area, the first frame makes a movement in the first frame placement area, the substrate cleaning and drying area, the first frame clamping area and the first frame return area, the first frame is provided with two fixtures, four power mechanisms and two first linkages, the fixtures are arranged in an opposite direction, two ends of each the fixture are respectively provided with the power mechanism, the power mechanisms respectively comprises a housing, a rack, a gear, an elastic element and a drive element, the rack is mutually meshed with the gear to be disposed in the housing, one side of the gear is connected to one end of the fixture, the elastic element abuts between the rack and the housing, the drive element is disposed on another side of the gear or the rack, and the drive element is exposed outside the housing, the first linkages are arranged in an opposite direction, two ends of each the first linkage are provided with the power mechanism, the first linkages are located between the fixtures.

In an embodiment of the substrate processing apparatus, the fixtures respectively include a lower fixing part, an upper clamping part and at least one connecting part, the lower fixing part is combined to the connecting part, and two ends of the lower fixing part are respectively connected between the two housings, the upper clamping part is actively provided in the connecting part, and two ends of the upper clamping part are respectively connected to sides of the two gears.

In an embodiment of the substrate processing apparatus, the power mechanisms respectively have at least one first positioning piece that is exposed outside the housing, the first positioning pieces are respectively combined to the two ends of the lower fixing part.

In an embodiment of the substrate processing apparatus, the sides of the gears respectively have a drive shaft, the drive shafts respectively combine the two ends of the upper clamping parts.

In an embodiment of the substrate processing apparatus, the lower fixing part has multiple lower clamping claws, the upper clamping part has multiple upper clamping claws, each the upper clamping claw corresponds to each the lower clamping claw.

In an embodiment of the substrate processing apparatus, the lower fixing part has multiple abutting pieces, the upper clamping part has multiple upper clamping claws, each the upper clamping claw corresponds to each the abutting piece.

In an embodiment of the substrate processing apparatus, the power mechanisms respectively include a positioning first frame, the positioning first frame is provided with a top cover and a base plate, the base plate has a guide rod, the positioning first frame is disposed in the housing, the rack and the gear are disposed in the positioning first frame, the guide rod passes through the elastic element, the rack is sleeved outside the elastic element, two ends of the elastic element respectively abut against the rack and the base plate, the top cover and the positioning first frame therebetween, as well as the base plate and the positioning first frame therebetween, is provided with a first airtight ring.

In an embodiment of the substrate processing apparatus, the drive element is rod-shaped, and disposed on another side of the gear, and the drive element is exposed outside the housing, the gear and the housing therebetween is provided with a second airtight ring.

In an embodiment of the substrate processing apparatus, the drive element is columnar, and disposed at the top of the rack, the drive element is exposed outside the top cover, the drive element and the top cover therebetween is provided with a second airtight ring.

In an embodiment of the substrate processing apparatus, the base plate is provided with a check valve, the check valve is communicated to the positioning first frame.

In an embodiment of the substrate processing apparatus, the substrate processing apparatus further comprises two second linkages, which are arranged in an opposite direction, two ends of each the second linkage are respectively provided with the power mechanism, the second linkages are respectively adjacent to the fixtures, and located between the first linkages.

In an embodiment of the substrate processing apparatus, the gripper includes a hinge and a claw, the claw is pivotally connected to the hinge, the claw is set to rotate relative to the insertion frame carrier, the control mechanism is connected to the hinge by signals, and controls the hinge to pivot the claw.

In an embodiment of the substrate processing apparatus, the lifting insertion frame mechanism further includes two auxiliary sliding members, disposed on two sides of the insertion frame carrier, and the two auxiliary sliding members each include a freewheel set arranged in a straight line.

In an embodiment of the substrate processing apparatus, the two auxiliary sliding members each include a power pivot shaft, pivotally connected the freewheel set.

In an embodiment of the substrate processing apparatus, the lifting insertion frame mechanism further includes an upper clamping claw, disposed above the insertion frame carrier.

In an embodiment of the substrate processing apparatus, the substrate processing apparatus further includes a positioning mechanism, which is disposed on two sides of the conveying track.

In an embodiment of the substrate processing apparatus, the positioning mechanism is a pneumatic cylinder.

In an embodiment of the substrate processing apparatus, the substrate processing apparatus further comprises a comb plate mechanism, which is disposed downstream of the positioning mechanism, the comb plate mechanism has downward-facing plural comb teeth.

In an embodiment of the substrate processing apparatus, the power member is a servo motor.

Accordingly, the substrate processing apparatus of the present application can be used for the transfer of the substrate, and can achieve the purpose of facilitating the transfer of the substrate to subsequent processes.

DETAILED DESCRIPTION OF THE INVENTION

Figure 1:
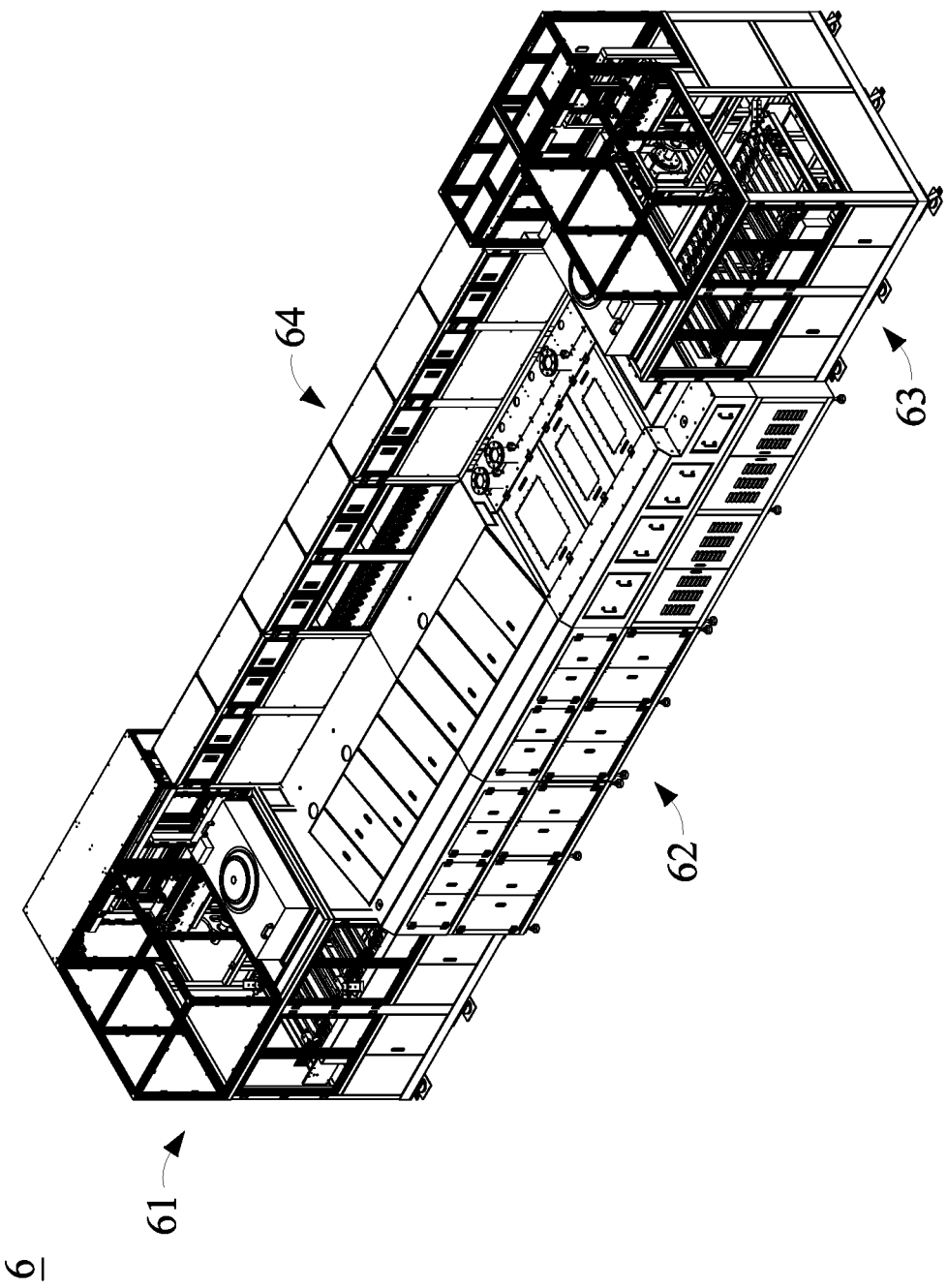
FIG. 1 is a schematic outside view of a substrate cleaning apparatus according to a preferable embodiment of the present application.
Figure 2:
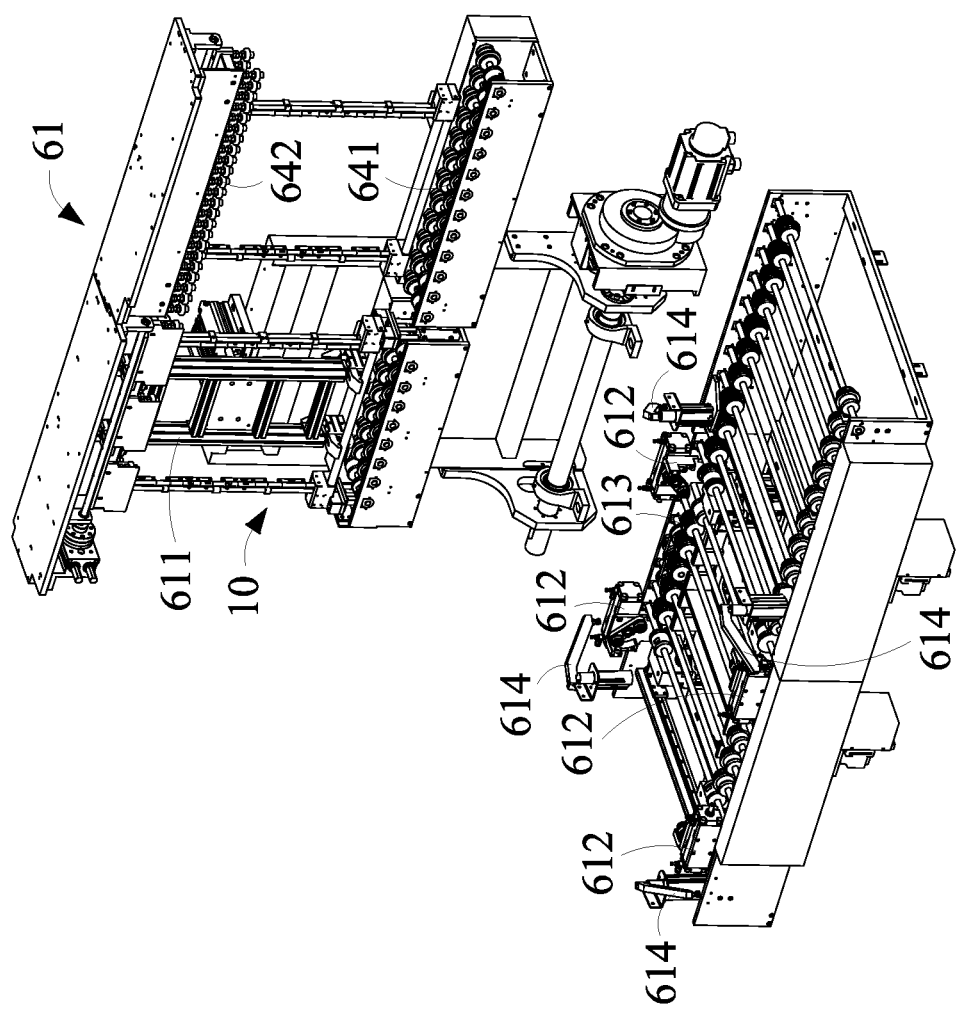
FIG. 2 is a schematic operational diagram 1 of the substrate cleaning apparatus placed with a first frame according to a preferable embodiment of the present application.
Figure 3:
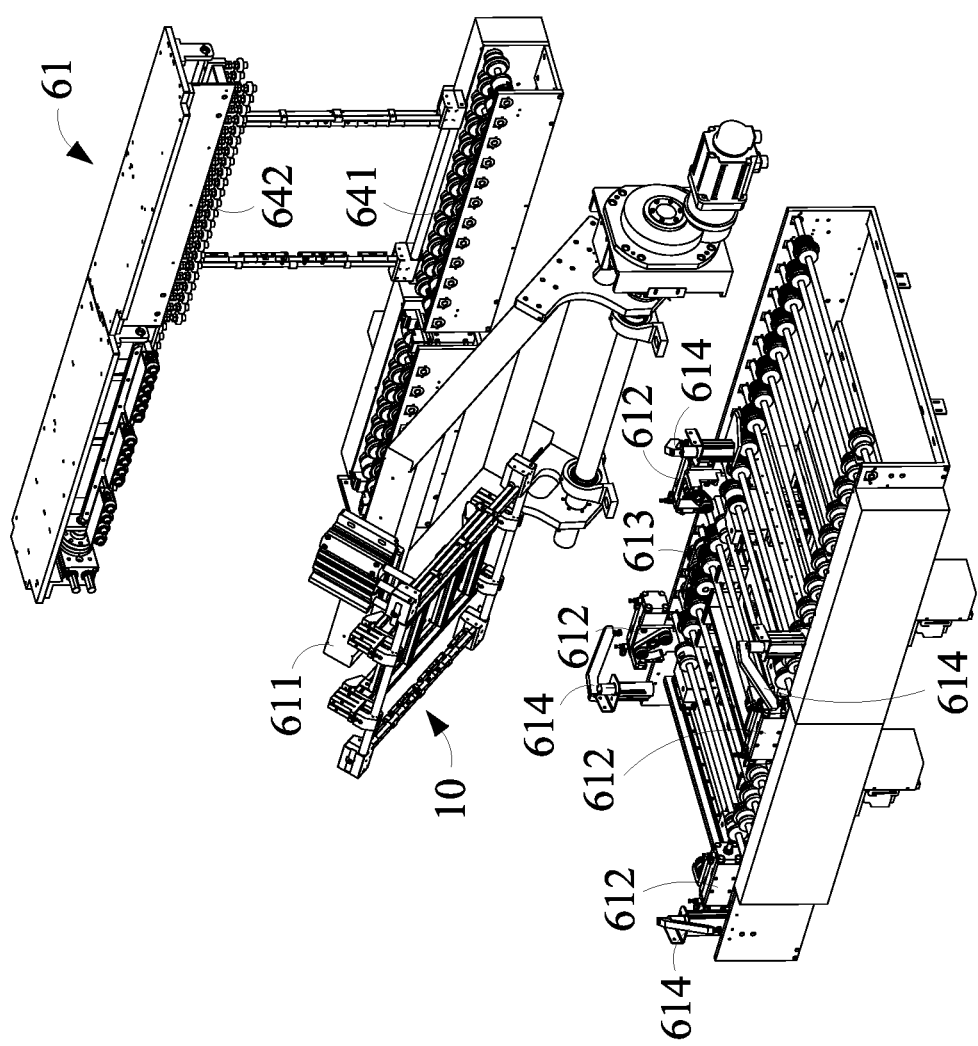
FIG. 3 is a schematic operational diagram 2 of the substrate cleaning apparatus placed with the first frame according to a preferable embodiment of the present application.
Figure 4:
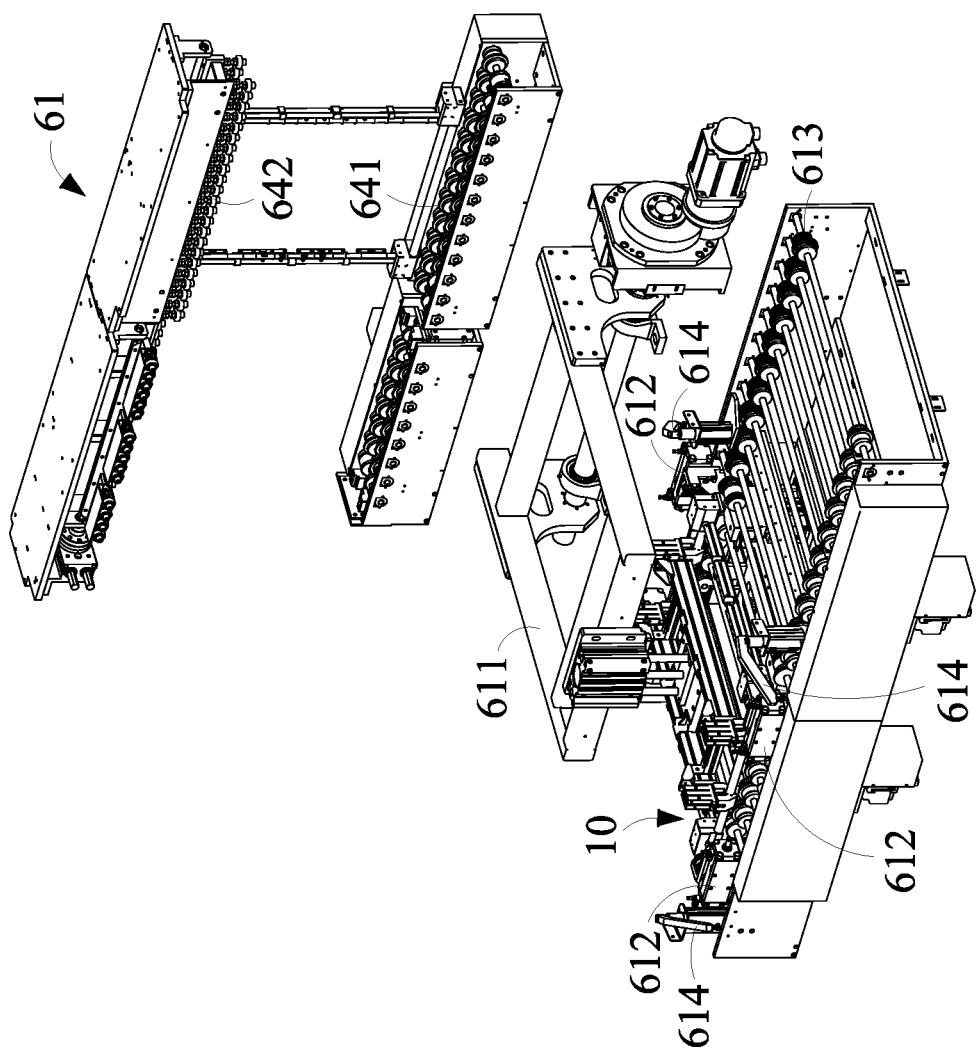
FIG. 4 is a schematic operational diagram 3 of the substrate cleaning apparatus placed with the first frame according to a preferable embodiment of the present application.
Figure 5:
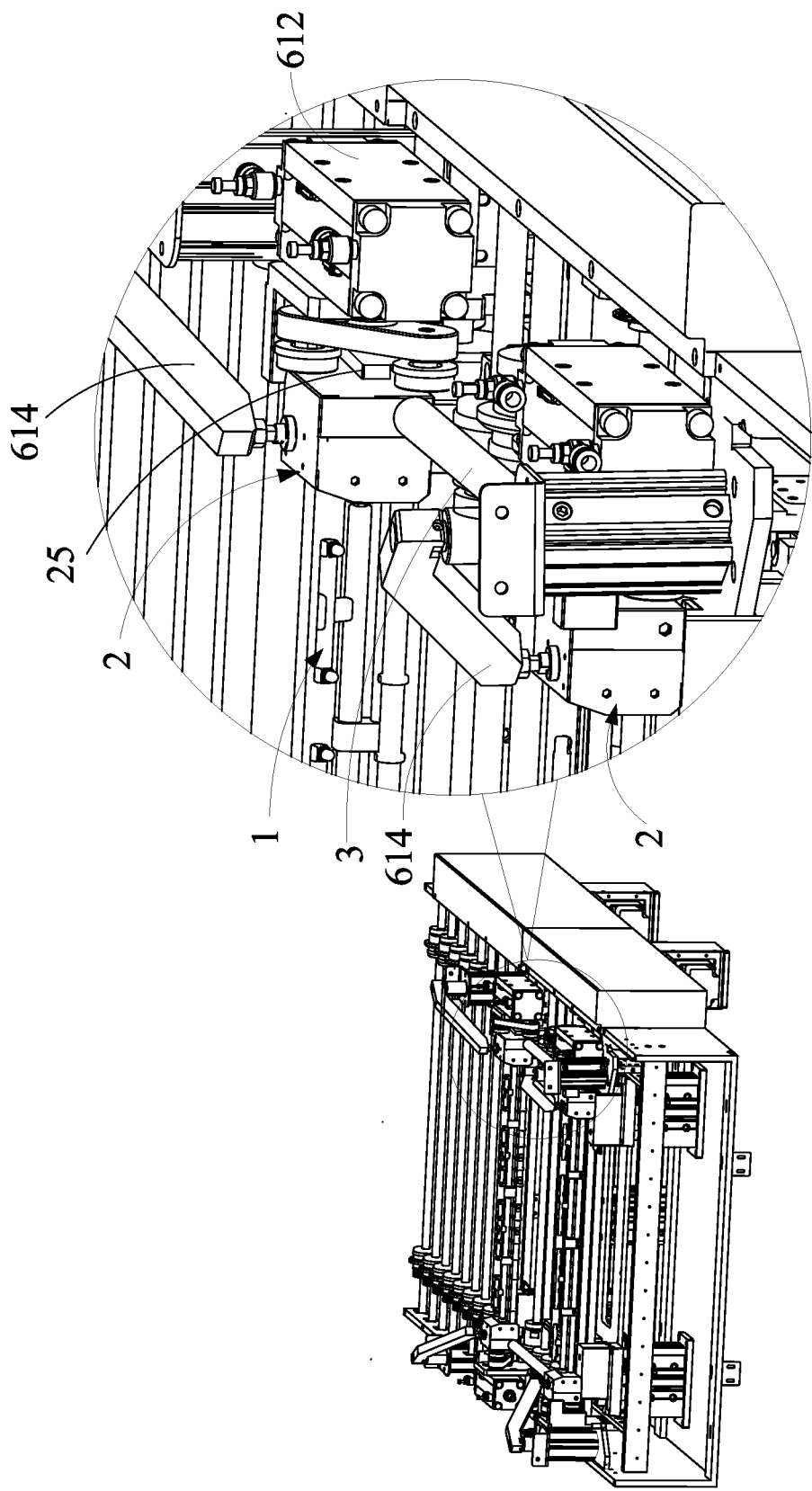
FIG. 5 is a schematic operational diagram 1 of the substrate cleaning apparatus opening a fixture according to a preferable embodiment of the present application.
Figure 6:
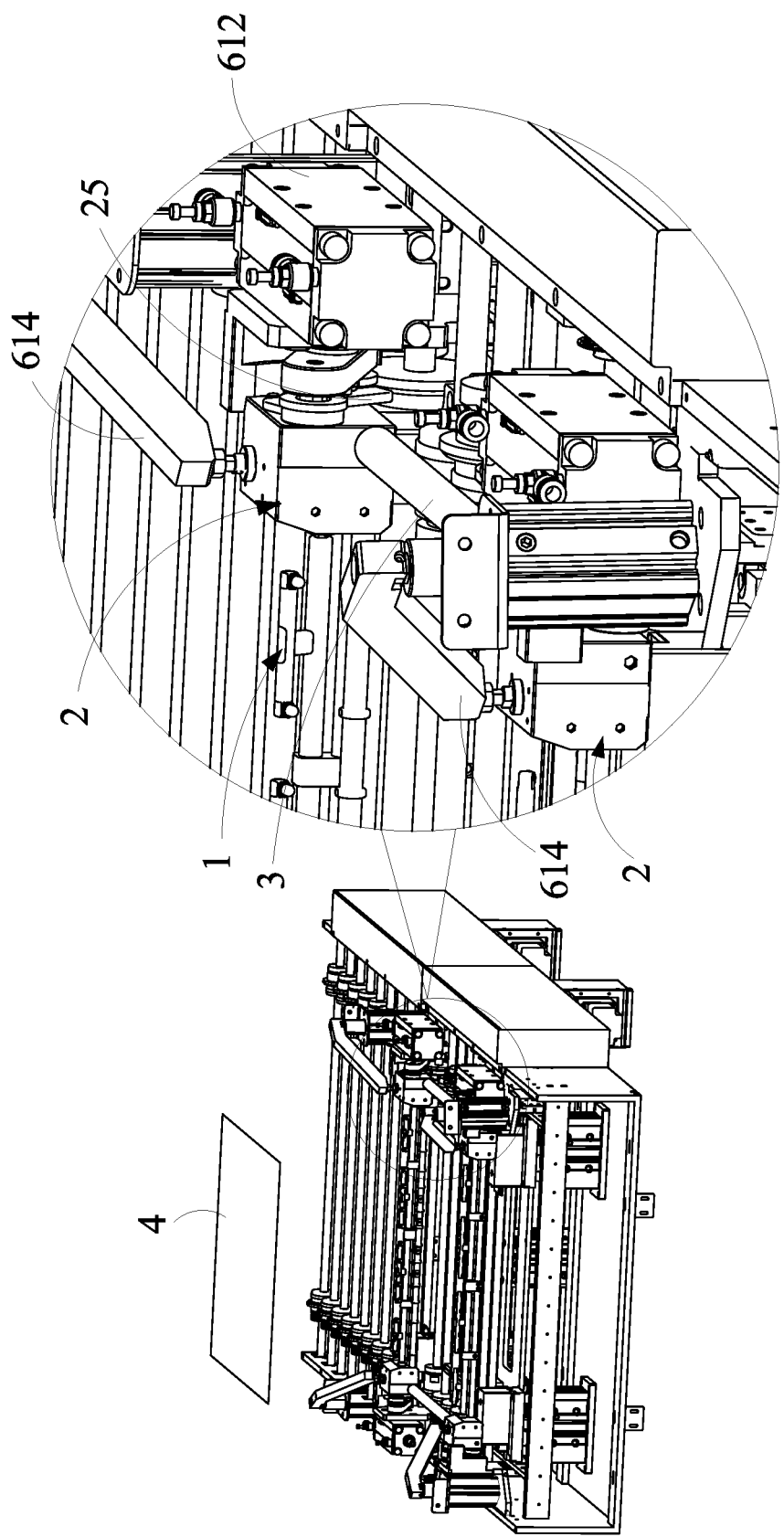
FIG. 6 is a schematic operational diagram 2 of the substrate cleaning apparatus opening the fixture according to a preferable embodiment of the present application.
Figure 7:
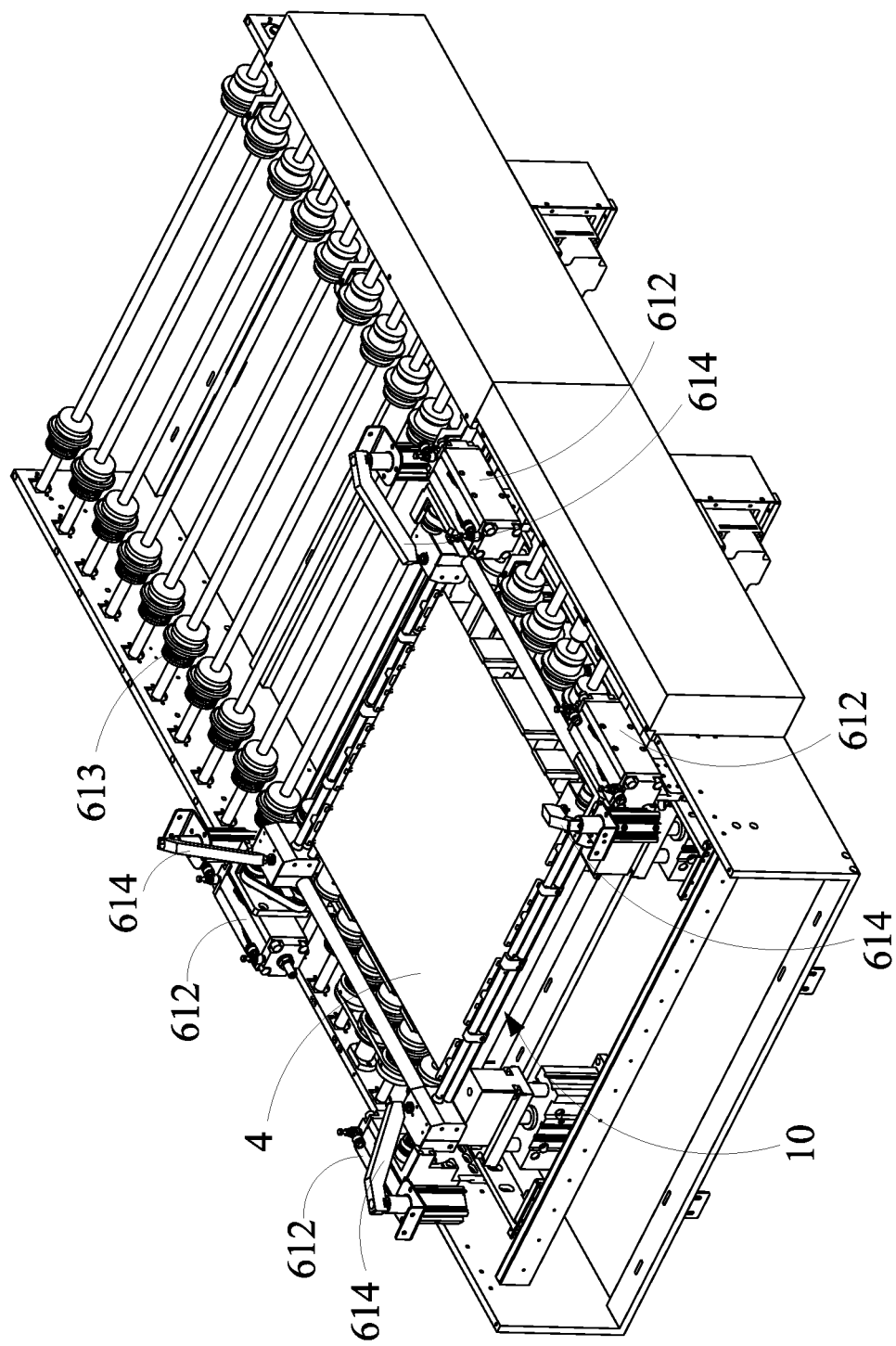
FIG. 7 is a schematic operational diagram of the substrate cleaning apparatus clamping a substrate according to a preferable embodiment of the present application.
Figure 8:
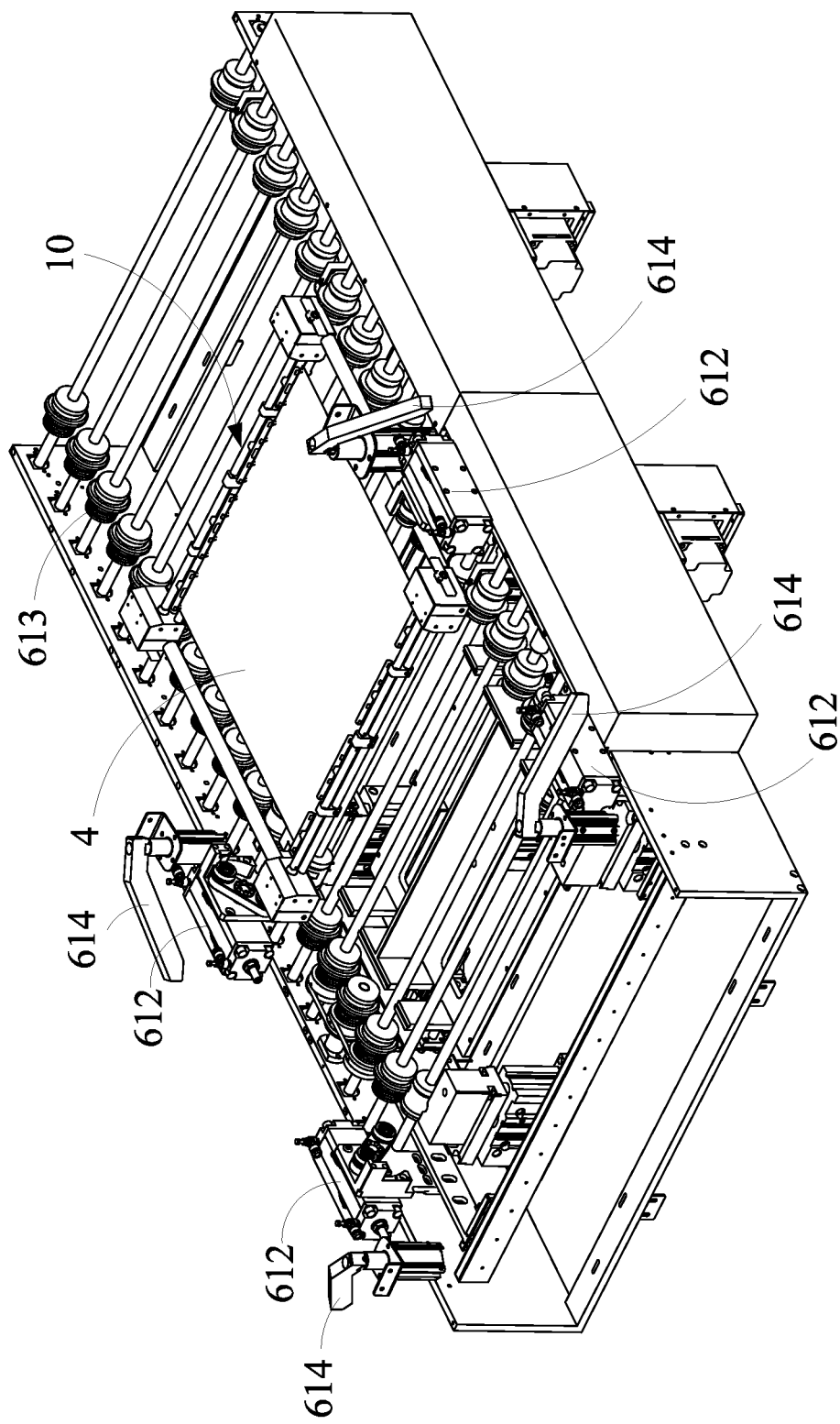
FIG. 8 is a schematic operational diagram of the substrate cleaning apparatus transferring the substrate according to a preferable embodiment of the present application.
Figure 9:
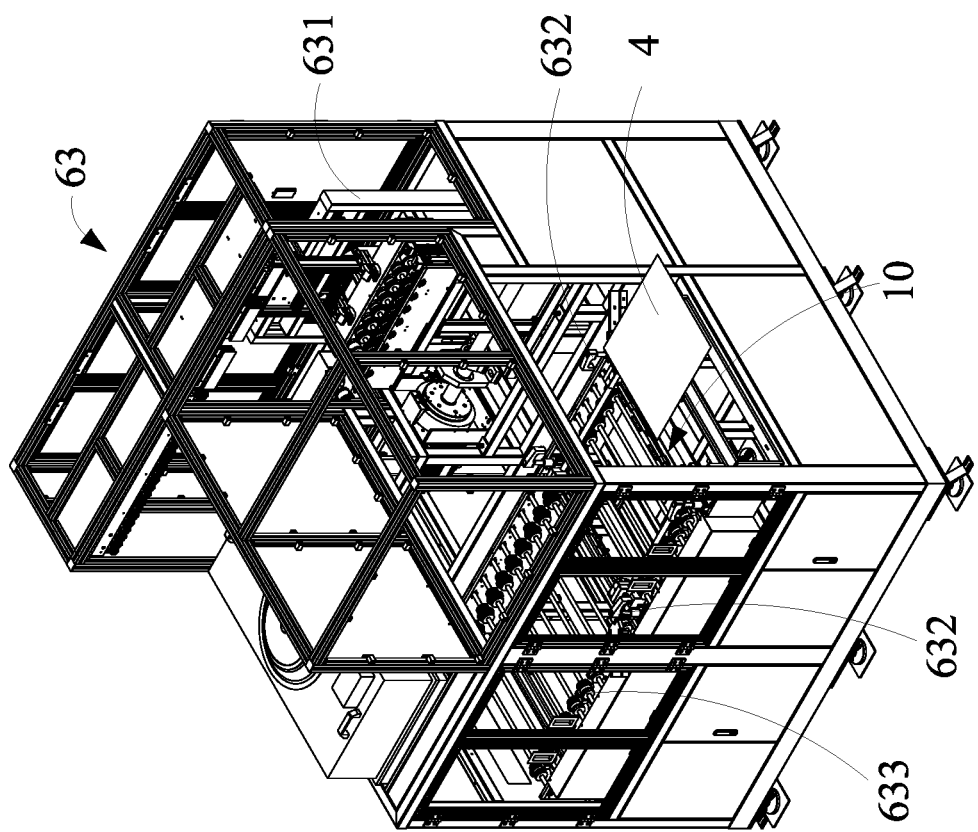
FIG. 9 is a schematic operational diagram of the substrate cleaning apparatus removing the substrate according to a preferable embodiment of the present application.
Figure 10:
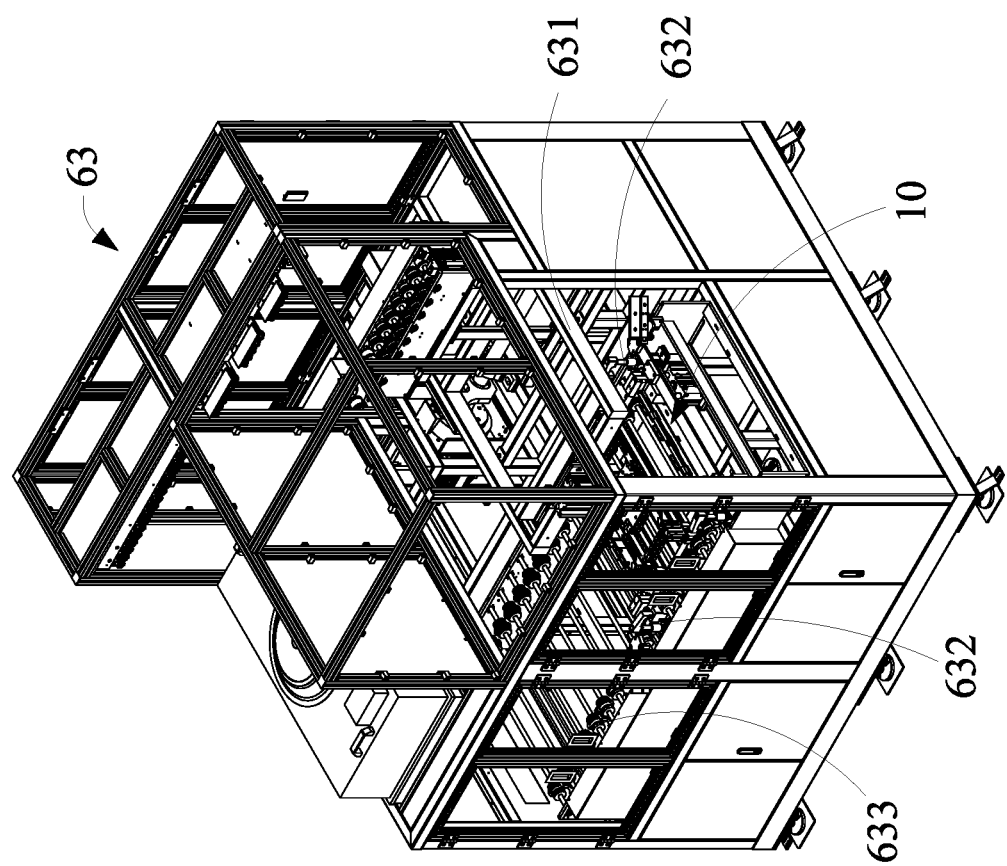
FIG. 10 is a schematic operational diagram 1 of the substrate cleaning apparatus picking up the first frame according to a preferable embodiment of the present application.
Figure 11:
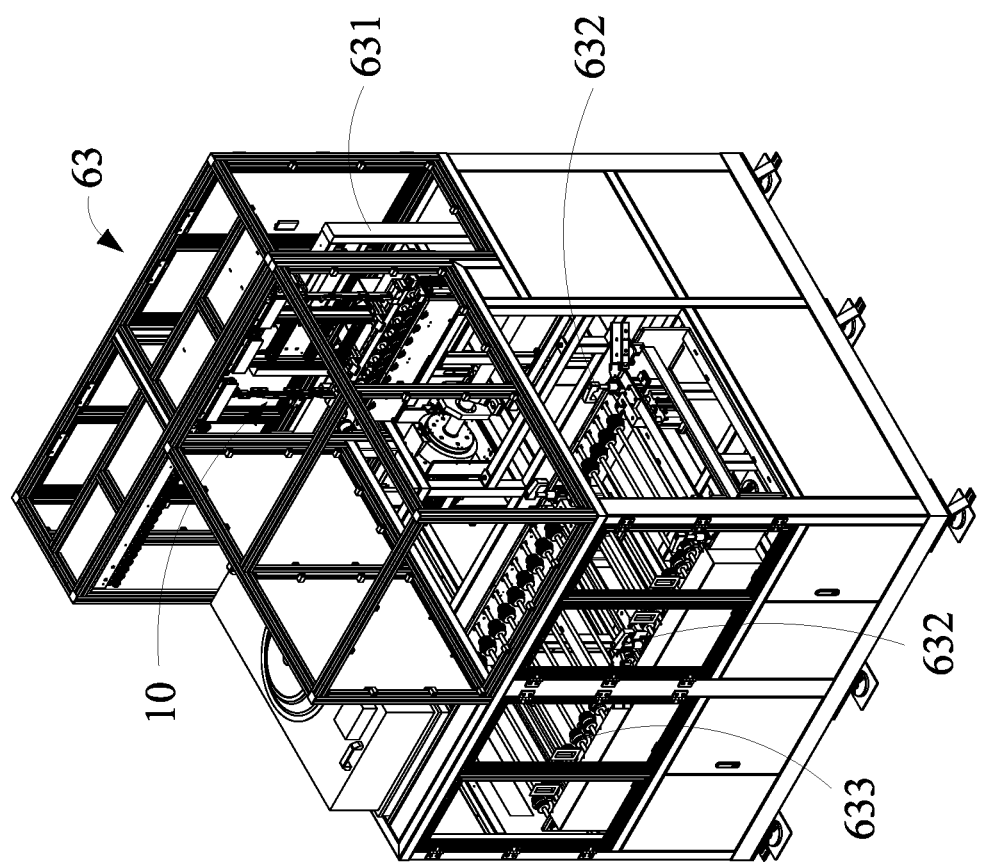
FIG. 11 is a schematic operational diagram 2 of the substrate cleaning apparatus picking up the first frame according to a preferable embodiment of the present application.

To facilitate understanding of the object, characteristics and effects of this present application, embodiments together with the attached drawings for the detailed description of the present application are provided.

Referring to FIGS. 1 to 11, the present application provides a substrate processing apparatus, comprising at least a substrate cleaning apparatus 6; wherein the substrate cleaning apparatus 6 may be equipped with other related apparatus of substrate processing.

The substrate cleaning apparatus 6 comprises a first frame 10, a first frame placement area 61, a substrate cleaning and drying area 62, a first frame clamping area 63 and a first frame return area 64, the substrate cleaning and drying area 62 is communicated to one side of the first frame placement area 61, the first frame clamping area 63 is communicated to one side of the substrate cleaning and drying area 62, the first frame return area 64 is communicated to the first frame clamping area 63 and located at one side of the first frame placement area 61, the substrate cleaning and drying area 62 and the first frame clamping area 63, the first frame 10 makes a movement in the first frame placement area 61, the substrate cleaning and drying area 62, the first frame clamping area 63 and the first frame return area 64.

Figure 18:
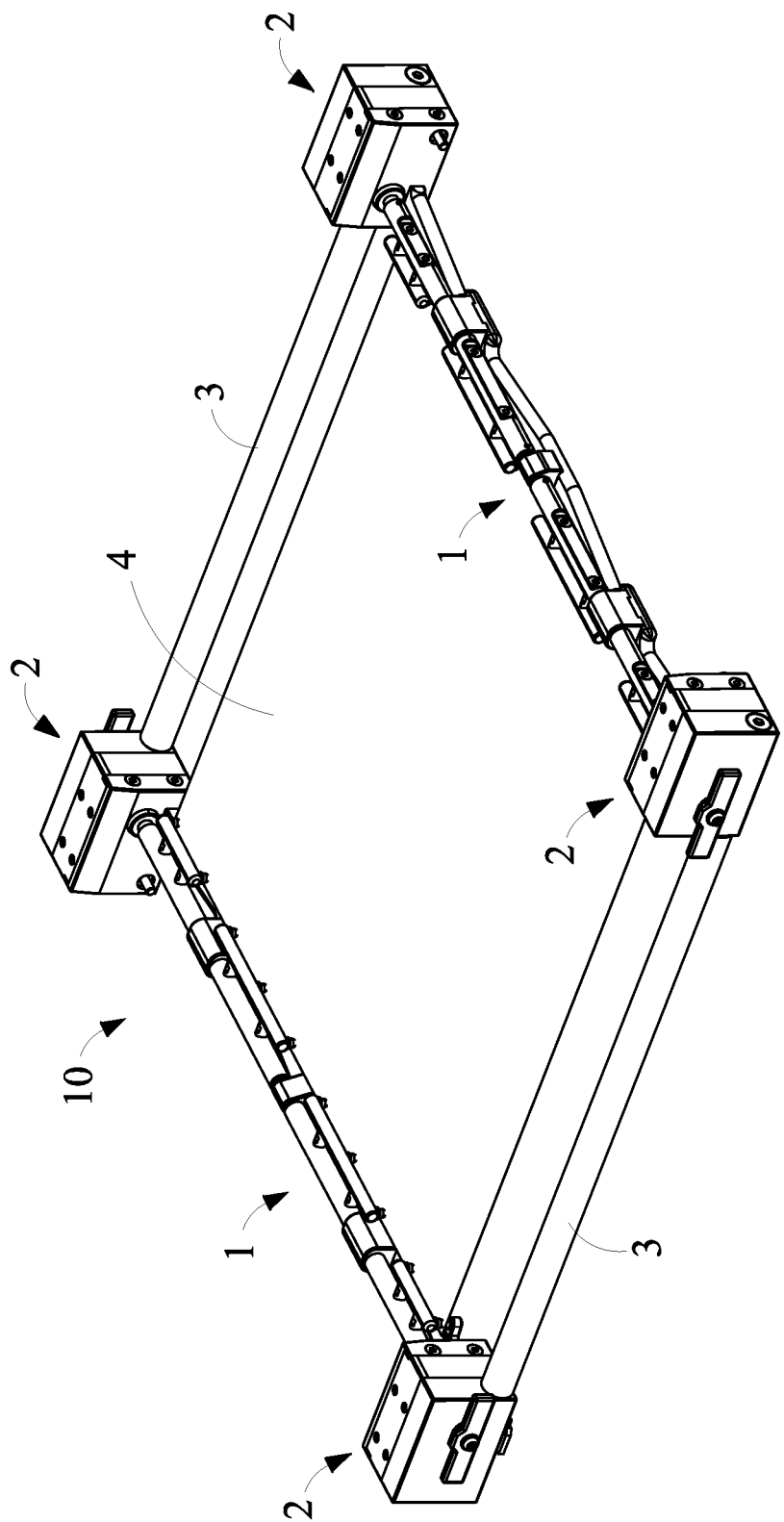
FIG. 18 is a schematic view of usage of the first frame according to a preferable embodiment of the present application.
Figure 19:
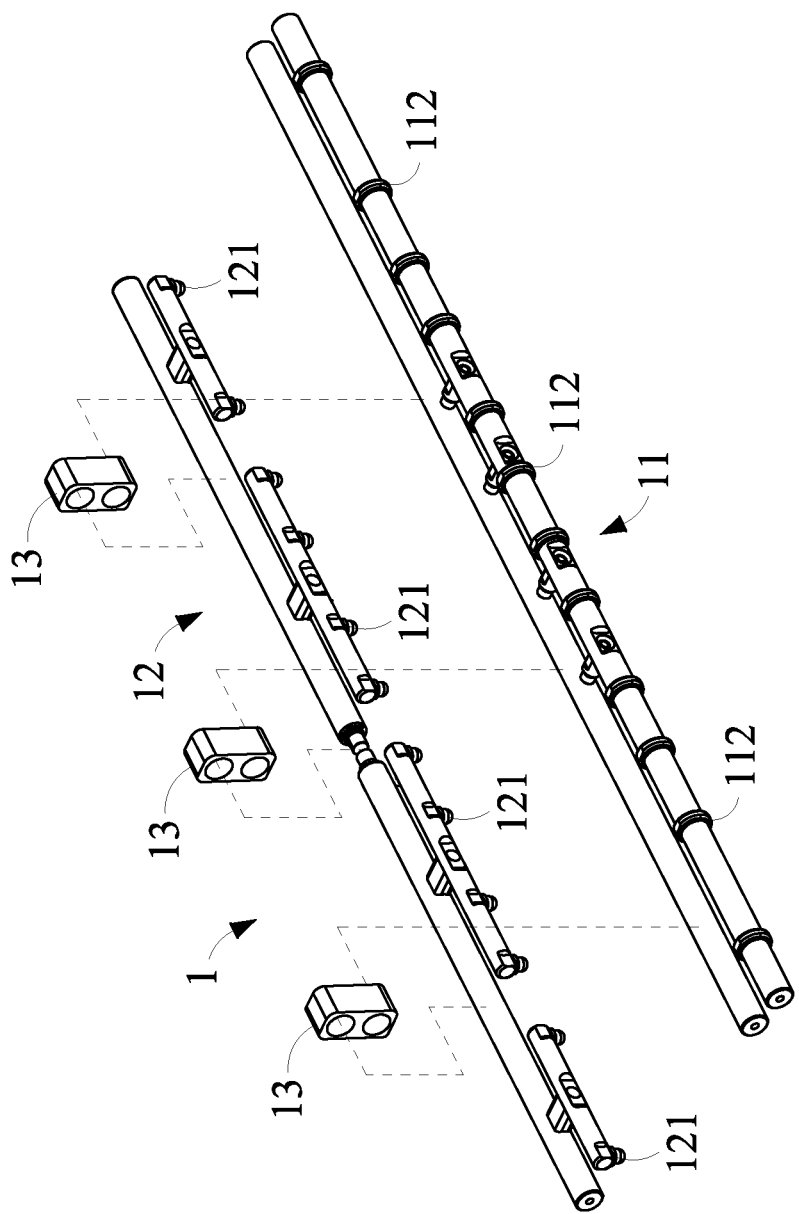
FIG. 19 is a schematic exploded view of another fixture according to a preferable embodiment of the present application.

As shown in FIGS. 1 to 11, in the present embodiment, when used, the upright first frame 10 in the first frame placement area 61 may horizontally be placed on the transmission rollers 613 by a placement mechanism 611, and a power mechanism 2 of the first frame 10 is adjacent to a fixture opening device 612, the four power mechanisms 2 of the first frame 10 may respectively be fixed by four fixing arms 614, and then the fixture opening device 612 uses two rollers thereof to pull a drive element 25 of the power mechanism 2 to open the fixture 1, and then a substrate 4 is placed into the fixture 1, next the fixture opening device 612 uses the two rollers thereof to slowly and reversely pull the drive element 25 of the power mechanism 2 to close the fixture 1, and the fixture 1 clamps the substrate 4, after the fixing arms 614 releases the four power mechanisms 2 of the first frame 10, the first frame 10 clamping the substrate 4 is transferred to the substrate cleaning drying area 62 to clean and dry the substrate 4 through the transmission rollers 613 of the first frame placement area 61, and then the first frame 10 is transferred to the first frame clamping area 63 through the transmission rollers 633 of the first frame clamping area 63, next the first frame clamping area 63 is provided with four fixing arms to fix the four power mechanisms 2 of the first frame 10, and then the fixture opening device 632 of the first frame clamping area 63 uses two rollers as shown in FIG. 18 and FIG. 19 to pull the drive element 25 of the power mechanism 2 to open the fixture 1, and then the cleaned substrate 4 is taken out by the fixture 1 for subsequent processes, next the fixture opening device 612 uses the two rollers thereof to slowly and reversely pull the drive element 25 of the power mechanism 2 to close the fixture 1. After the fixing arms release the four power mechanisms 2 of the first frame 10, a clamping mechanism 631 of the first frame clamping area 63 clamps the horizontal first frame 10 into upright, and then upper return rollers 641 and lower return rollers 642 of the first frame return area 64 return the first frame 10 to the first frame placement area 61 in preparation for the next round of substrate cleaning procedures.

After the substrate 4 completes the cleaning procedure by the substrate cleaning apparatus 6, other procedures may be performed, or a relevant insertion frame apparatus (not shown) is directly used to perform the insertion frame.

As shown in FIGS. 12 to 25, in the present embodiment, the first frame 10 is provided with two fixtures 1, four power mechanisms 2 and two first linkages 3, the fixtures 1 are arranged in an opposite direction and may be parallel to each other.

As shown in FIGS. 12 to 25, in the present embodiment, two ends of each the fixture 1 are respectively provided with the power mechanism 2, the power mechanisms 2 respectively comprise a housing 21, a rack 22, a gear 23, an elastic element 24 and a drive element 25, the housing 21 may have a front housing and a rear housing, the rack 22 is arranged up and down, and mutually meshed with the gear 23 that is arranged front and back to be disposed in the housing 21, a front side of the gear 23 passes through the housing 21 to connect to one end of the fixture 1, the elastic element 24 may be a telescopic spring and abut between the rack 22 and the housing 21, a rear side of the gear 23 passes through the housing 21 to connect the drive element 25, the drive element 25 is exposed outside the housing 21, and the drive element 25 may be rod-shaped.

In the present embodiment, the first linkages 3 of the first frame 10 are parallel to a transmission direction. Further, the first frame 10 shown in FIG. 25 may also be applied to the substrate cleaning apparatus 6, and the first frame 10 may be parallel to transmission direction with the second linkages 7 to avoid the fixture 1 hindering the cleaning and drying of the substrate 4. Further, the upper return rollers 641 or the lower return rollers 642 of the first frame return area 64 may control the transfer or stop transfer by segment to avoid a collision between the first frames 10 at returning a plurality of the first frames 10.

In the present embodiment, as shown in FIG. 1, the first linkages 3 are arranged in an opposite direction and may be parallel to each other, two ends of each the first linkage 3 are provided with the power mechanism 2, the first linkage 3 may have a convex body (or groove) to combine a groove (or convex body) of the power mechanism 2, the first linkages 3 are located between the fixtures 1, and the first linkages 3 and the fixtures 1 may be perpendicular to each other to form a square or rectangle, the power mechanism 2 may respectively be located at four corners of the square or the rectangle.

In the present embodiment, as shown in FIGS. 12 to 18, when the present application is used, an external force may be used to turn the drive elements 25 for driving the gears 23 to open the fixtures 1 and move down the racks 22 and press down the elastic elements 24, and then a substrate 4 may be placed in the fixtures 1, next the drive elements 25 may be slowly released, so that the elastic elements 24 release compression energy to push the racks 22 up and drive the gears 23 to reverse, next the gears 23 may close the fixtures 1 to clamp the substrate 4 by an abutting force of the elastic elements 24. Accordingly, the substrate processing apparatus 10 of the present application may be used for the transfer of the substrate 4 to facilitate the transfer of the substrate 4 to subsequent processes.

As shown in FIGS. 12 to 18, in an embodiment of the present application, the fixtures 1 may respectively include a lower fixing part 11, an upper clamping part 12 and at least one connecting part 13, the lower fixing part 11 is combined to the connecting part 13, and two ends of the lower fixing part 11 are respectively connected between the two housings 21, the upper clamping part 12 is pivotally provided in the connecting part 13, and two ends of the upper clamping part 12 are respectively connected to two front sides of the two gears 23. Accordingly, the drive elements 25 may drive the gears 23 to bring the upper clamping parts 12 turning, in order to open the fixtures 1 and move down the racks 22 and press down the elastic elements 24, and then the substrate 4 may be placed on the lower fixing parts 11, next the drive elements 25 may be slowly released, so that the elastic elements 24 release compression energy to push the racks 22 up and drive the gears 23 to reverse, next the gears 23 may reverse the upper clamping parts 12 to close the fixtures 1 to clamp the substrate 4 by an abutting force of the elastic elements 24 and the upper clamping parts 12 and the lower fixing parts 11.

Figure 12:
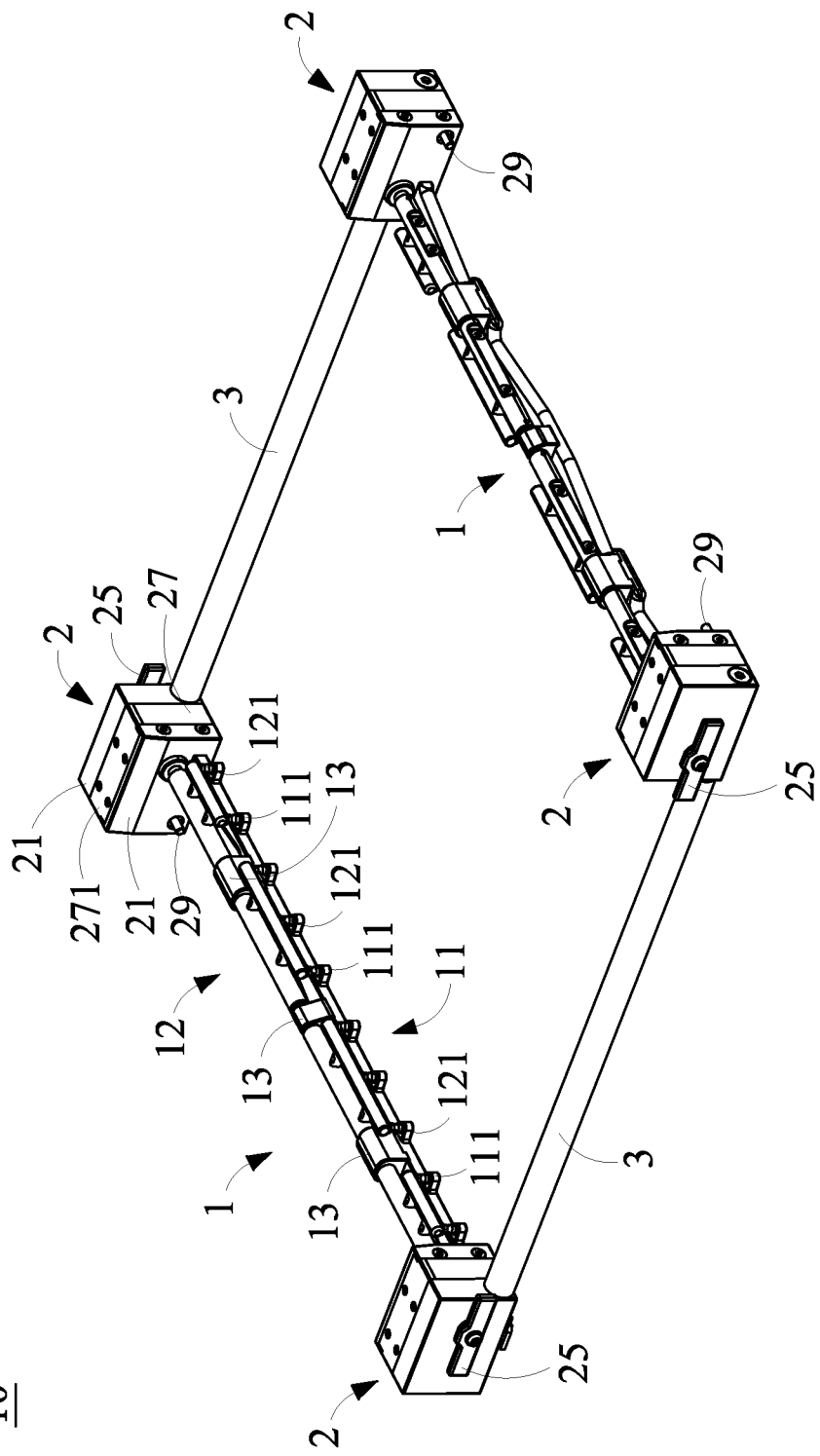
FIG. 12 is a schematic combinational view of the first frame according to a preferable embodiment of the present application.
Figure 13:
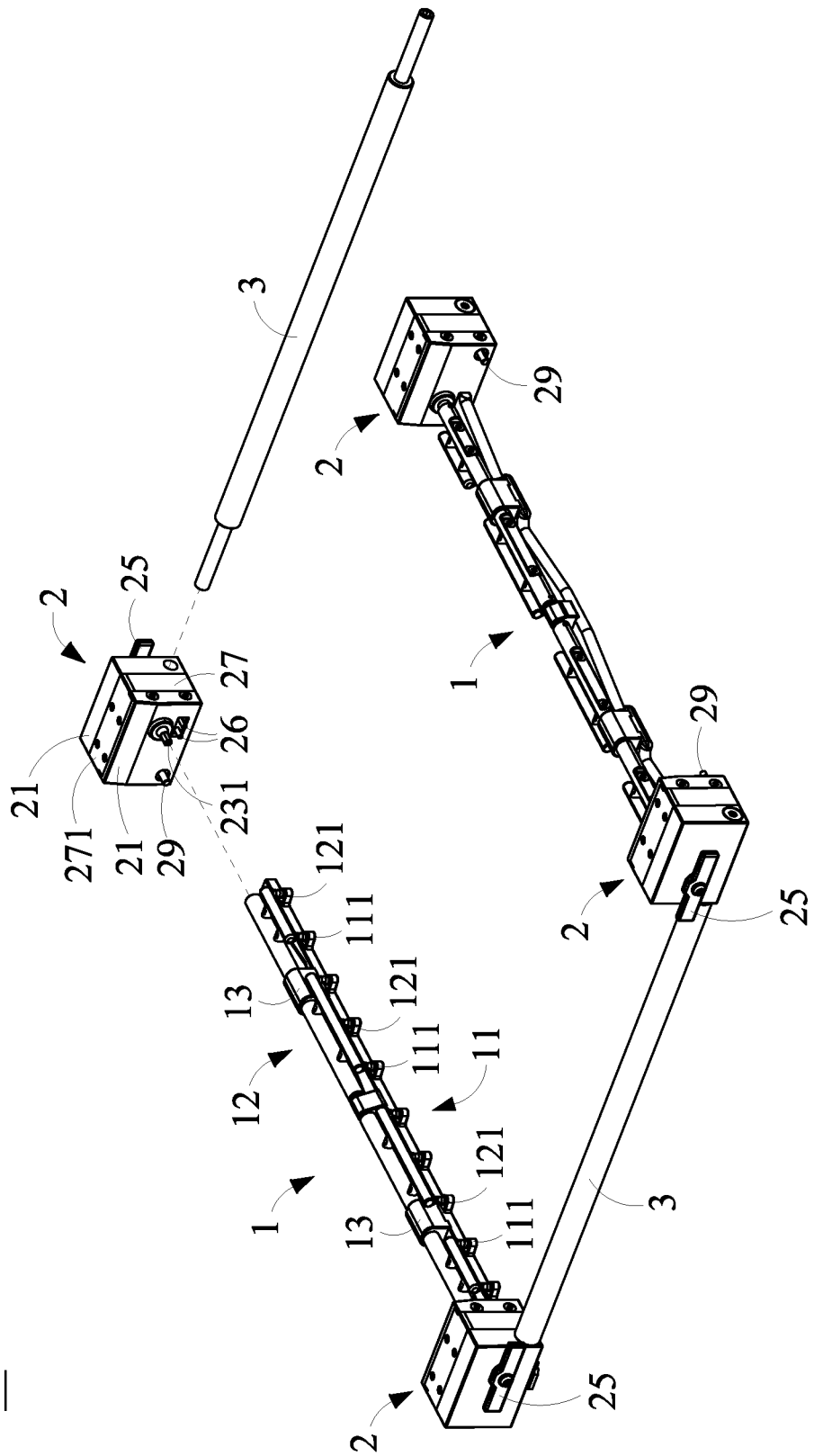
FIG. 13 is a schematic exploded view of the first frame according to a preferable embodiment of the present application.
Figure 14:
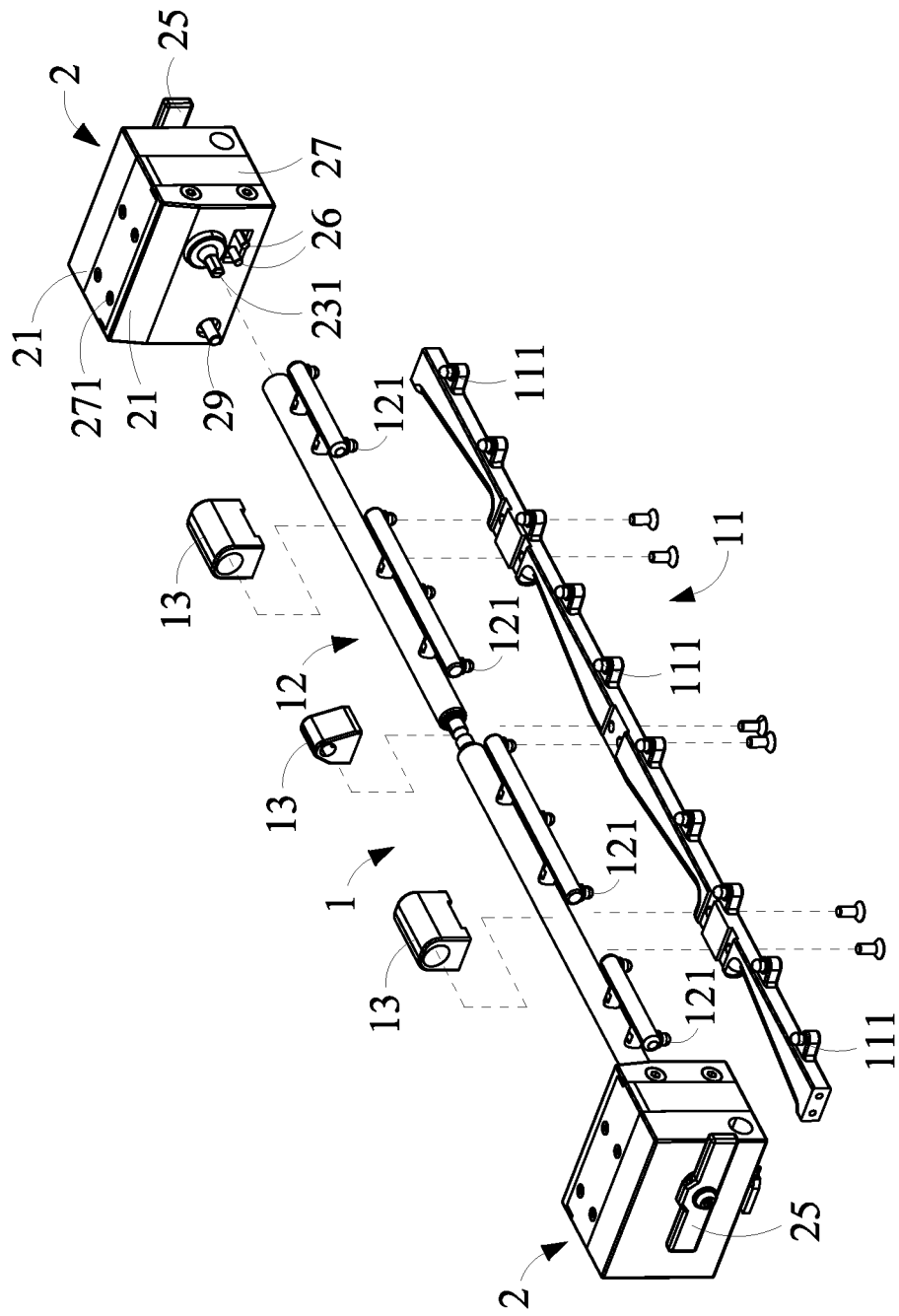
FIG. 14 is a schematic exploded view of the fixture according to a preferable embodiment of the present application.
Figure 15:
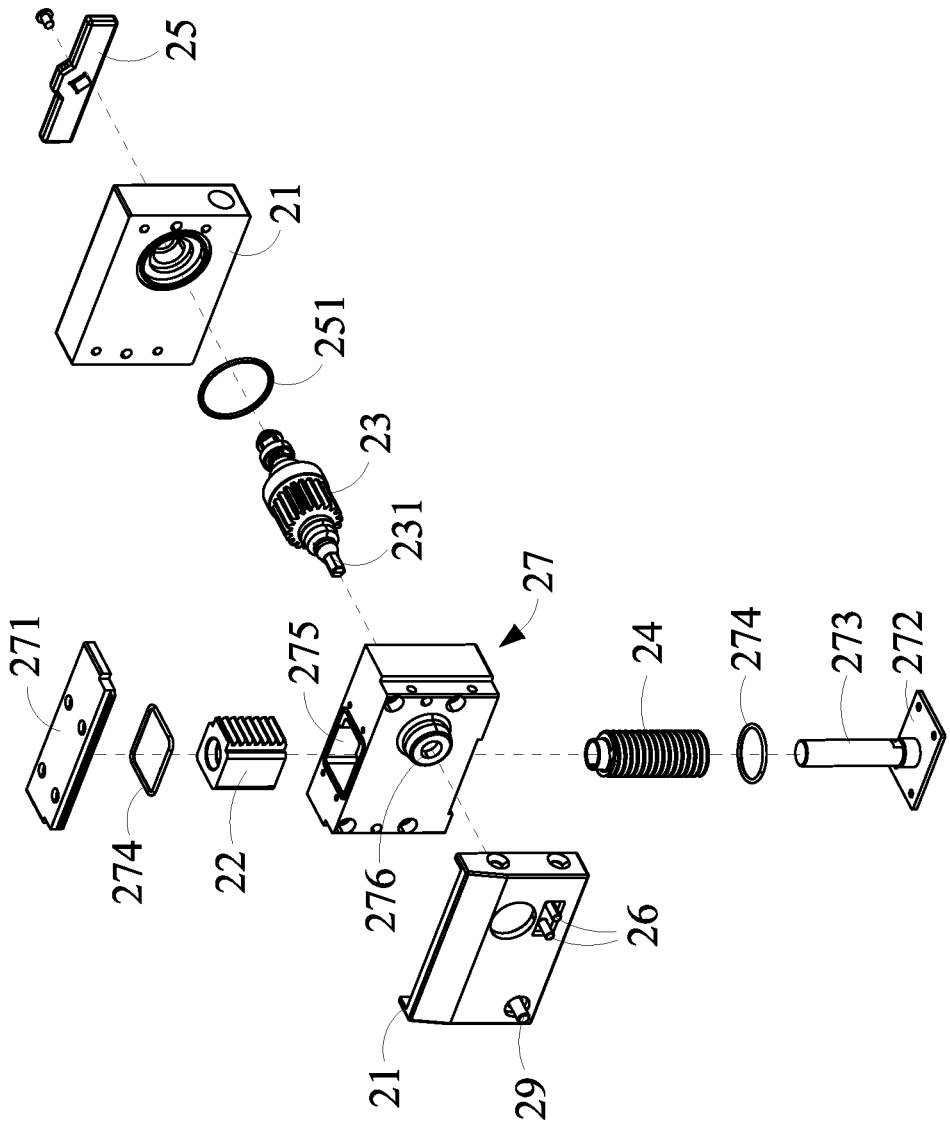
FIG. 15 is a schematic exploded view 1 of a power mechanism according to a preferable embodiment of the present application.
Figure 16:
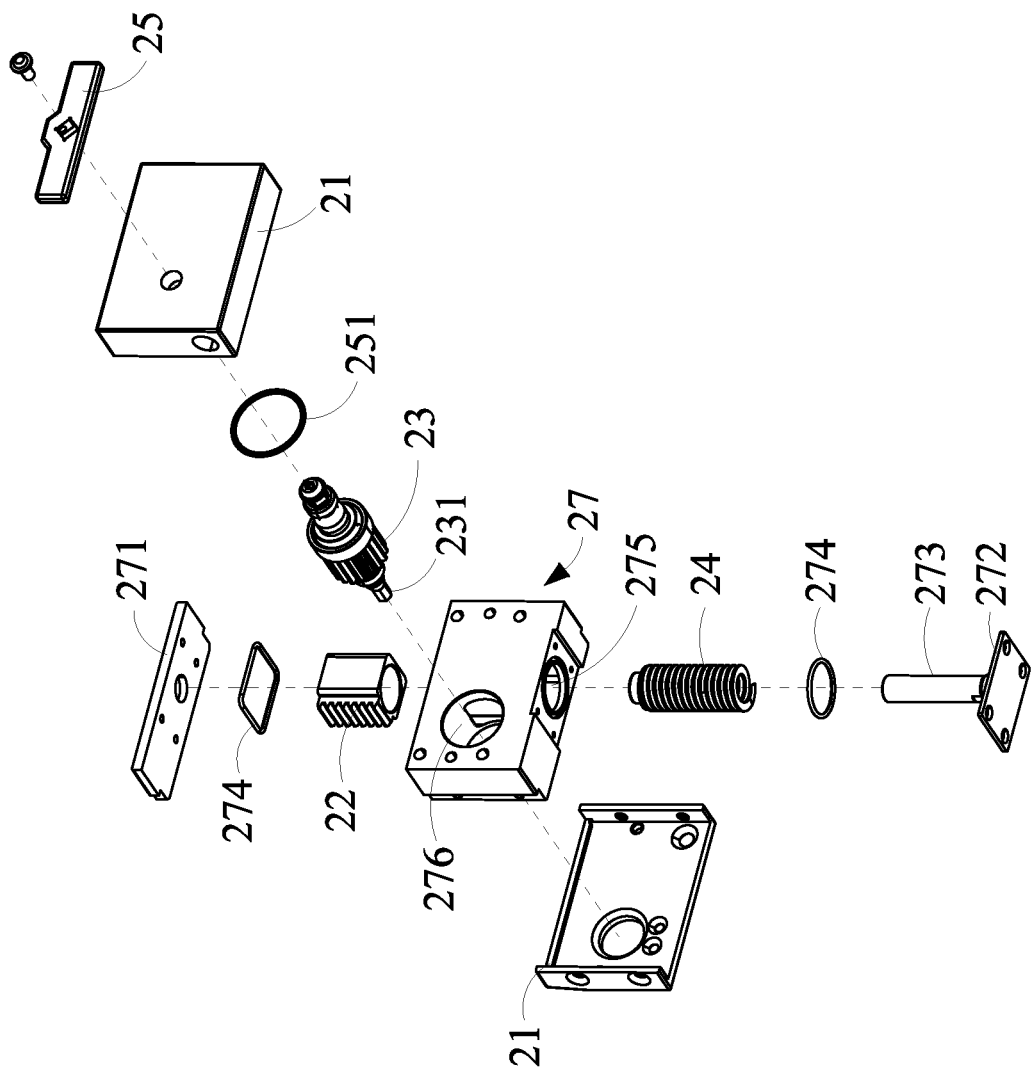
FIG. 16 is a schematic exploded view 2 of the power mechanism according to a preferable embodiment of the present application.
Figure 17:
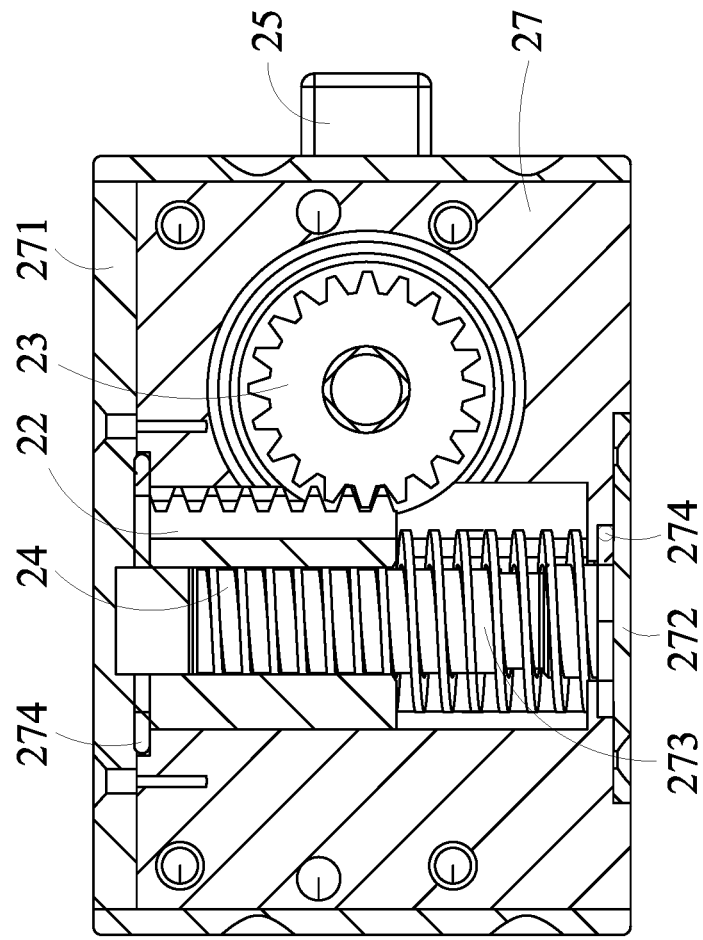
FIG. 17 is a schematic sectional view of the power mechanism according to a preferable embodiment of the present application.

As shown in FIGS. 12 to 14, in an embodiment of the present application, the power mechanisms 2 may respectively have at least one first positioning piece 26 that is exposed outside the housing 21, the first positioning pieces 26 are respectively combined to the two ends of the lower fixing part 11, the first positioning piece 26 may be a convex body (or groove) to combine a groove (or convex body) of the lower fixing part 11. Accordingly, the fixtures 1 may be firmly combined with the power mechanisms 2.

As shown in FIGS. 12 to 16, in an embodiment of the present application, the front sides of the gears 23 may respectively have a drive shaft 231, the drive shafts 231 may respectively be a polyangular prism to combine the polyangular grooves at the two ends of the upper clamping parts 12. Accordingly, the drive shafts 231 may stably drive the upper clamping parts 12 turning.

As shown in FIGS. 1 to 14 and FIG. 18, in an embodiment of the present application, the lower fixing parts 11 of the fixtures 1 may respectively have multiple lower clamping claws 111, the upper clamping parts 12 may respectively have multiple upper clamping claws 121, each the upper clamping claw 121 corresponds to each the lower clamping claw 111. Accordingly, when the upper clamping parts 12 of the fixtures 1 move towards the direction of the lower fixing parts 11 to make the fixtures 1 closed, each the upper clamping claw 121 may correspond to and abut against each the lower clamping claw 111, so that the upper clamping parts 12 of the fixtures 1 may cooperate with the lower fixing parts 11 to firmly clamp the substrate 4 or release the substrate 4, in order to facilitate the transfer of the substrate 4 to subsequent processes. Further, the upper clamping claws 121 and the lower clamping claws 111 may also reduce the area that the substrate 4 is clamped.

Figure 20:
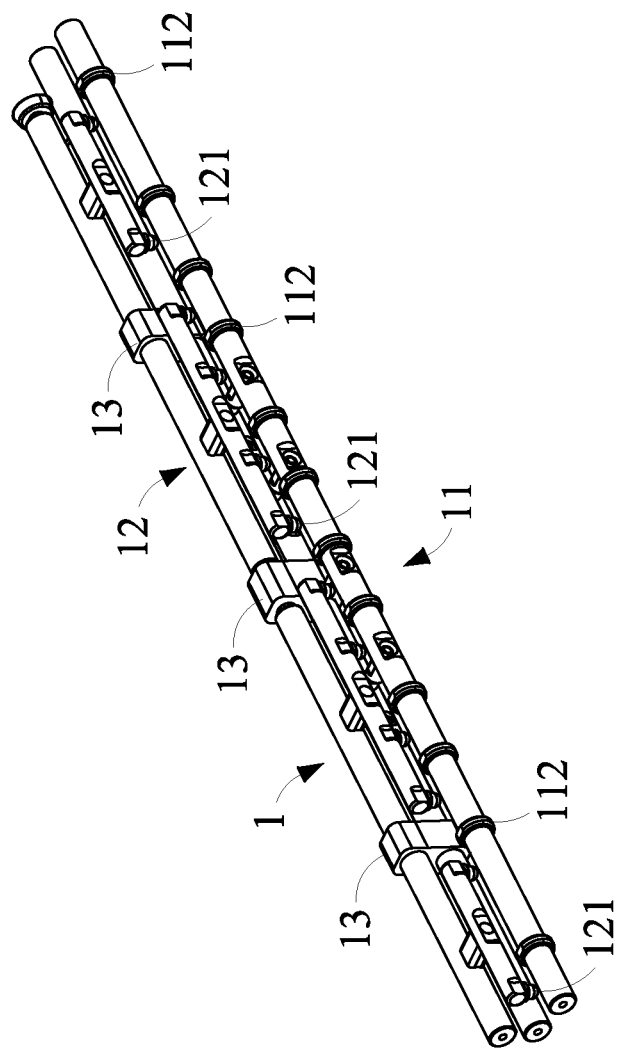
FIG. 20 is a schematic combinational view of another fixture according to a preferable embodiment of the present application.
Figure 21:
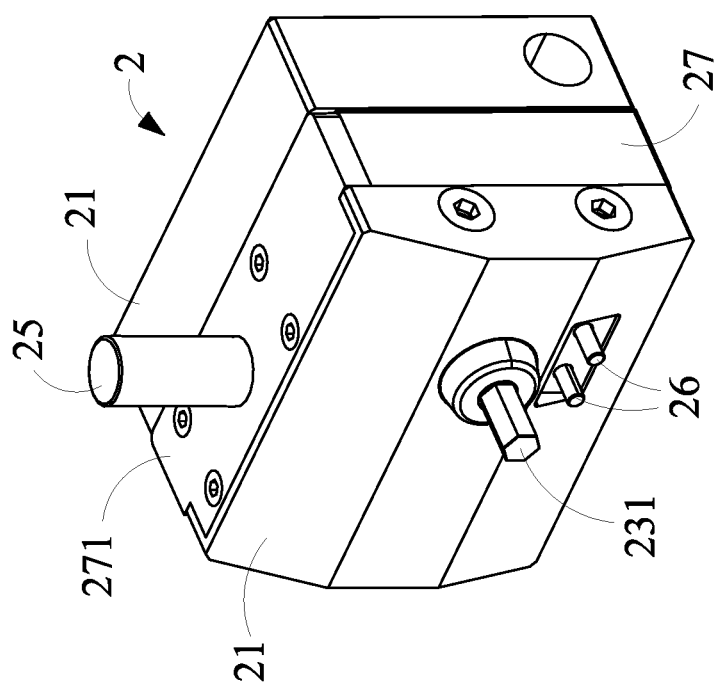
FIG. 21 is a schematic combinational view of another power mechanism according to a preferable embodiment of the present application.
Figure 22:
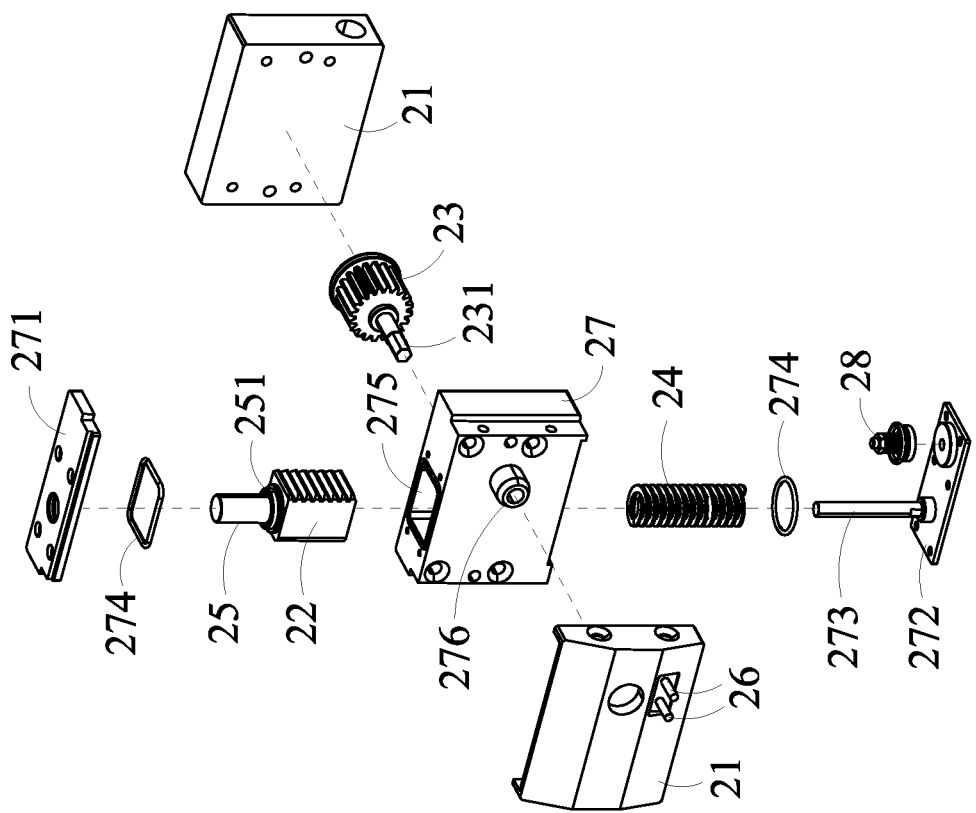
FIG. 22 is a schematic exploded view 1 of another power mechanism according to a preferable embodiment of the present application.
Figure 23:
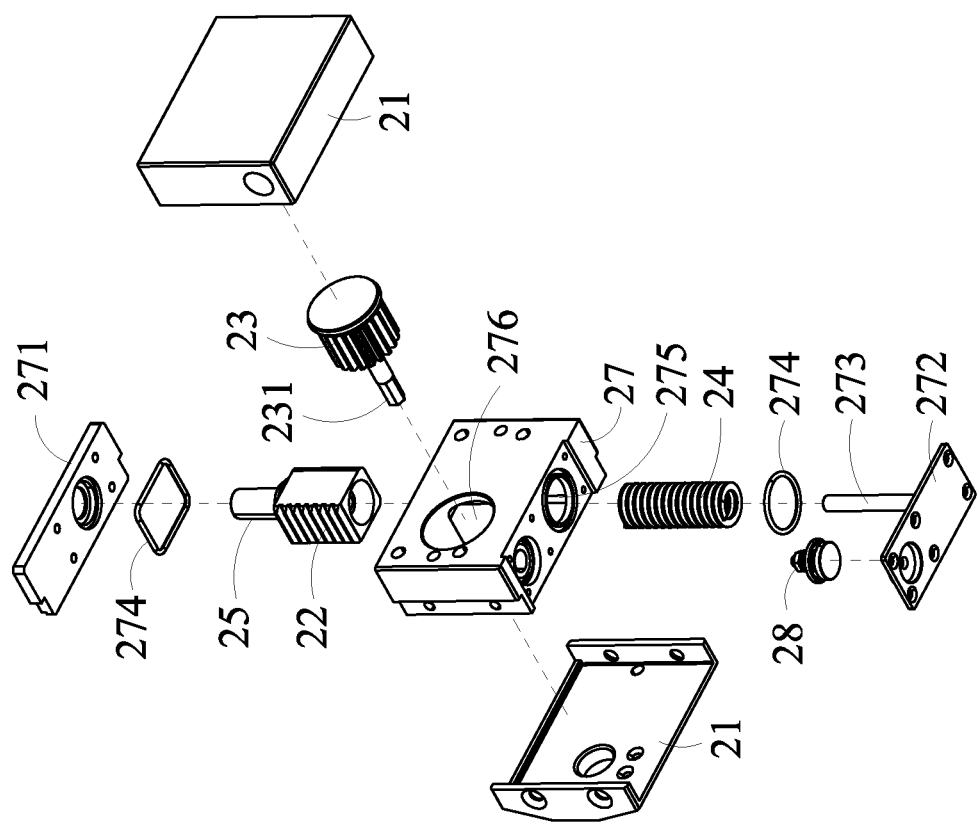
FIG. 23 is a schematic exploded view 2 of another power mechanism according to a preferable embodiment of the present application.
Figure 24:
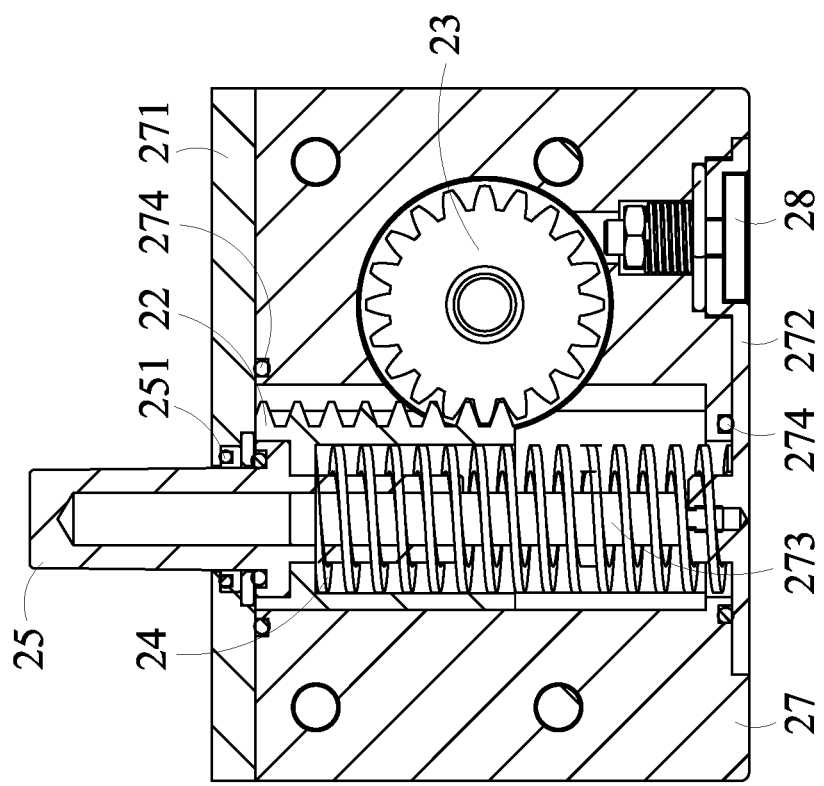
FIG. 24 is a schematic sectional view of another power mechanism according to a preferable embodiment of the present application.

As shown in FIGS. 19 and 20, in an embodiment of the present application, the lower fixing parts 11 of the fixture 1 may respectively have multiple abutting pieces 112, the upper clamping parts 12 may respectively have multiple upper clamping claws 121, each the upper clamping claw 121 corresponds to each the abutting piece 112, each the abutting piece 112 may have a narrow abutting surface to correspond to each the upper clamping claw 121. Accordingly, when the upper clamping parts 12 of the fixtures 1 move towards the direction of the lower fixing parts 11 to make the fixtures 1 closed, each the upper clamping claw 121 may correspond to and abut against each the abutting piece 112, so that the upper clamping parts 12 of the fixtures 1 may cooperate with the lower fixing parts 11 to firmly clamp the substrate 4 or release the substrate 4, in order to facilitate the transfer of the substrate 4 to subsequent processes. Further, the upper clamping claws 121 and the abutting pieces 112 may also reduce the area that the substrate 4 is clamped.

As shown in FIGS. 12 to 17, in an embodiment of the present application, the power mechanisms 2 may respectively further include a positioning first frame 27, the positioning first frames 27 may respectively be provided with a top cover 271 and a base plate 272, the base plates 272 may respectively have a guide rod 273, the positioning first frame 27 may be disposed between the front housing and the rear housing of the housing 21, the rack 22 is movably disposed in an accommodating channel 275 of the positioning first frame 27 that is arranged up and down, the gear 23 is movably disposed in an accommodating channel 276 of the positioning first frame 27 that is arranged front and back, the guide rod 273 passes through the elastic element 24, the rack 22 is sleeved outside the elastic element 24, two ends of the elastic element 24 respectively abut against the rack 22 and the base plate 272, the top cover 271 and the positioning first frame 27 therebetween, as well as the base plate 272 and the positioning first frame 27 therebetween, may be provided with a first airtight ring 274, the first airtight ring 274 may be square, rectangular or round. Accordingly, the first airtight rings 274 may make the positioning first frame 27 form an airtight effect that can prevent foreign objects from entering the positioning first frame 27 to affect the movement of the rack 22 and the gear 23, and the rack 22 and the gear 23 can achieve the effect of easy to drive because of the effect of air tightness.

As shown in FIGS. 12 to 16, in an embodiment of the present application, the drive elements 25 may each be rod-shaped to be disposed on the rear side of the gear 23 by a screw, and the drive elements 25 are exposed outside the housings 21, the gear 23 and the housing 21 therebetween is provided with a second airtight ring 251. Further, the rear side of the gear 23 may have a polyangular convex body to be combined with a polyangular opening of the drive element 25, so that anti-rotation is formed between the drive element 25 and the gear 23, and thus the drive element 25 may drive the gear 23 turning. Accordingly, an airtight effect can be formed between the positioning first frame 27 and the gear 23 that can prevent foreign objects from entering the positioning first frame 27 to affect the movement of the rack 22 and the gear 23, and the drive element 25 can achieve the effect of easy to drive the gear 23 because of the effect of air tightness.

The power mechanism 2 shown in FIGS. 21 to 24 differs from the power mechanism 2 shown in FIGS. 14 to 17 in that the drive elements 25 may each be columnar to be disposed at the top of the racks 22, the drive element 25 is exposed outside the top cover 271, the drive element 25 and the top cover 271 therebetween is provided with a second airtight ring 251. Accordingly, an airtight effect can be formed between the drive element 25 and the top cover 271 that can prevent foreign objects from entering the positioning first frame 27 to affect the movement of the rack 22 and the gear 23, and the drive element 25 can achieve the effect of easy to drive the rack 22 because of the effect of air tightness. Further, when the present application is used, an external force may be used to press the drive elements 25 for driving the gears 23 to open the fixtures 1 and move down the racks 22 and press down the elastic elements 24, and then a substrate 4 may be placed in the fixtures 1, next the drive elements 25 may be slowly released, so that the elastic elements 24 release compression energy to push the racks 22 up and drive the gears 23 to reverse, next the gears 23 may close the fixtures 1 to clamp the substrate 4 by an abutting force of the elastic elements 24. Accordingly, the substrate processing apparatus 10 of the present application may be used for the transfer of the substrate 4 to facilitate the transfer of the substrate 4 to subsequent processes.

As shown in FIGS. 21 to 24, in an embodiment of the present application, the base plate 272 of the power mechanism 2 may be provided with a check valve 28, the check valve 28 is communicated to the positioning first frame 27. Accordingly, when the power mechanism 2 is operated, the check valve 28 may discharge the gas in the positioning first frame 27, so that the positioning first frame 27 is close to the vacuum, and thus the rack 22 and the gear 23 achieve the effect of easy to drive.

Figure 25:
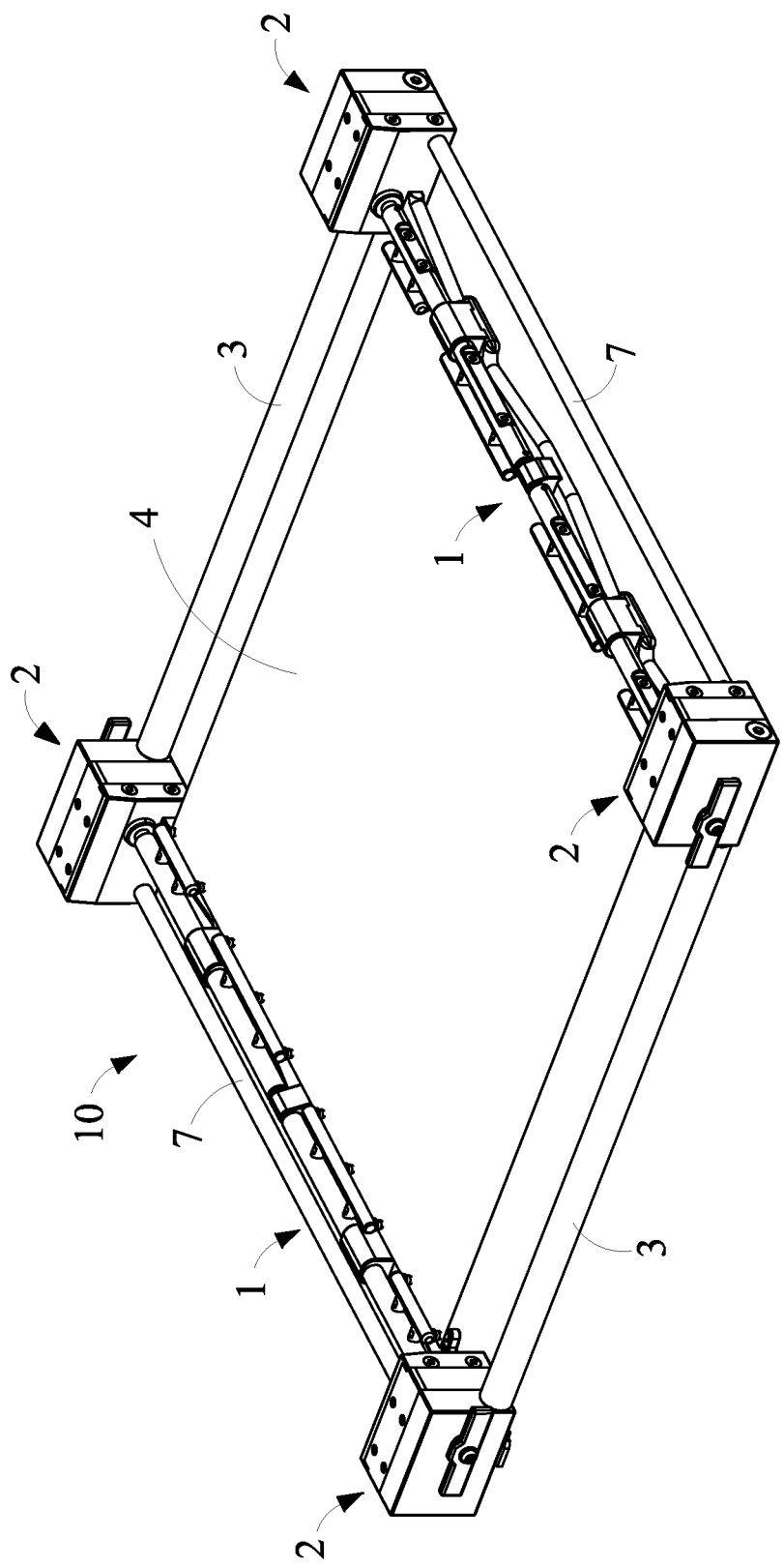
FIG. 25 is a schematic combinational view of another first frame according to a preferable embodiment of the present application.

The first frame 10 shown in FIG. 25 differs from the first frame 10 shown in FIG. 18 in that the first frame 10 of FIG. 25 may further comprise two second linkages 7, the second linkages 7 may be arranged in an opposite direction, two ends of each the second linkage 7 are respectively provided with the power mechanism 2, the second linkages 7 are respectively adjacent to the fixtures 1, and located between the first linkages 3. The first linkages 3 and the second links 7 may be perpendicular to each other to form a square or rectangle, the power mechanisms 2 may respectively be located at the four corners of the square or the rectangle. Accordingly, the substrate processing apparatus 10 of the present application may select the first linkages 3 to be parallel to the transmission direction, or the second linkages 7 to be parallel to the transmission direction according to the needs of practical operation.

While the present invention has been described by means of specific embodiments, those skilled in the art should understand the above description is merely embodiments of the invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A substrate processing apparatus, comprising:
a substrate cleaning apparatus, comprising:
a first frame, provided with two fixtures, four power mechanisms and two first linkages, wherein the two fixtures are arranged at two opposite sides of the first frame, each of the power mechanisms comprises a housing, a rack, a gear, an elastic element and a drive element, the rack is mutually meshed with the gear to be disposed in the housing, each of the power mechanisms is connected to a corresponding end of each of the two fixtures via one side of the gear, the elastic element abuts between the rack and the housing, the drive element is disposed on another side of the gear or the rack, and the drive element is exposed outside the housing, the first linkages are arranged at two opposite sides of the first frame, each of the first linkages has two ends, wherein each end of each of the first linkages is provided with one of the four power mechanisms, each of the first linkages is located between the two fixtures;
a first frame placement area, configured to place the first frame, wherein the first frame placement area is provided with a placement mechanism, a fixture opening device and multiple fixing arms, the first frame is horizontally placed on multiple transmission rollers by the placement mechanism, the first frame is used for placing a substrate and is fixed by the multiple fixing arms;
a substrate cleaning and drying area, communicated to one side of the first frame placement area, wherein the first frame having fixed the substrate is moved through the multiple transmission rollers from the first frame placement area to the substrate cleaning and drying area to clean and dry the substrate;
a first frame clamping area, communicated to one side of the substrate cleaning and drying area, wherein the first frame is moved through the multiple transmission rollers from the substrate cleaning and drying area to the first frame clamping area after the substrate has been cleaned and dried, then the substrate is taken out by the two fixtures, a clamping mechanism is provided in the first frame clamping area to clamp the first frame from a horizontal position to an upright position, and
a first frame return area, communicated to the first frame clamping area and located at one side of the first frame placement area, the substrate cleaning and drying area and the first frame clamping area, wherein the first frame return area includes multiple upper return rollers and multiple lower return rollers, after the substrate is taken out from the first frame, the first frame is moved through the multiple upper return rollers and the multiple lower return rollers from the first frame clamping area through the first frame return area and is returned to the first frame placement area.

2. The substrate processing apparatus according to claim 1, wherein the two fixtures respectively include a lower fixing part, an upper clamping part and at least one connecting part, the lower fixing part is combined to the at least one connecting part, and two ends of the lower fixing part are respectively connected between two of the housings of the power mechanisms, the upper clamping part is actively provided in the at least one connecting part, and two ends of the upper clamping part are respectively connected to sides of two of the gears of the power mechanisms.

3. The substrate processing apparatus according to claim 2, wherein the power mechanisms respectively have at least one first positioning piece that is exposed outside the housing, the at least one first positioning piece is combined to the two ends of the lower fixing part; one side of the gear has a drive shaft, two of the drive shafts of the gears respectively connect the two ends of the upper clamping part; the lower fixing part has multiple lower clamping claws, the upper clamping part has multiple upper clamping claws, each of the upper clamping claws corresponds to each of the lower clamping claws; the lower fixing part has multiple abutting pieces, the upper clamping part has multiple upper clamping claws, each of the upper clamping claws corresponds to each of the abutting pieces.

4. The substrate processing apparatus according to claim 1, wherein the power mechanisms respectively include a positioning first frame, the positioning first frame is provided with a top cover and a base plate, the base plate has a guide rod, the positioning first frame is disposed in the housing, the rack and the gear are disposed in the positioning first frame, the guide rod passes through the elastic element, the rack is sleeved outside the elastic element, two ends of the elastic element respectively abut against the rack and the base plate, the top cover and the positioning first frame therebetween, as well as the base plate and the positioning first frame therebetween, is provided with a first airtight ring.

5. The substrate processing apparatus according to claim 4, wherein the drive element is rod-shaped, and disposed on another side of the gear, and the drive element is exposed outside the housing, the gear and the housing of each of the power mechanisms therebetween is provided with a second airtight ring; or the drive element is columnar, and disposed at top of the rack, the drive element is exposed outside the top cover, the drive element and the top cover of each of the power mechanisms therebetween is provided with the second airtight ring; the base plate is provided with a check valve, the check valve is communicated to the positioning first frame.

6. The substrate processing apparatus according to claim 1, further comprising two second linkages, which are arranged at two opposite sides of the first frame different from the two first linkages, two ends of each of the second linkages are respectively provided with each of the power mechanisms, the second linkages are respectively adjacent to the two fixtures, and located between the first linkages.

* * * * *